United States Patent [19]
Tamura et al.

[11] Patent Number: 5,592,004
[45] Date of Patent: Jan. 7, 1997

[54] SILICON NITRIDE FILM HAVING A SHORT ABSORPTION WAVELENGTH AND SURROUNDING CRYSTAL-LIKE GRAIN BOUNDARIES

[75] Inventors: Muneo Tamura; Takeshi Yamauchi; Katuhide Niwa; Takeshi Fukazawa; Akira Kuroyanagi; Tooru Yamaoka, all of Kariya, Japan

[73] Assignee: Nippondenso Co., Ltd., Kariya, Japan

[21] Appl. No.: 534,976

[22] Filed: Sep. 28, 1995

[30] Foreign Application Priority Data

Sep. 30, 1994 [JP] Japan ................................. 6-261595
Sep. 6, 1995 [JP] Japan ................................. 7-255635

[51] Int. Cl.$^6$ ......................... H01L 29/06; H01L 29/78
[52] U.S. Cl. ........................ 257/323; 257/649; 257/316
[58] Field of Search ................................. 257/323, 640, 257/649, 632, 314, 315, 316

[56] References Cited

U.S. PATENT DOCUMENTS

| | | | |
|---|---|---|---|
| 4,532,022 | 7/1985 | Takasaki et al. | 204/192 D |
| 4,618,541 | 10/1986 | Forouhi et al. | 257/640 |
| 4,665,426 | 5/1987 | Allen et al. | 257/640 |
| 4,933,206 | 6/1990 | Cox | 427/53.1 |
| 5,260,236 | 11/1993 | Petro et al. | 437/241 |
| 5,483,097 | 1/1996 | Ohtsuki et al. | 257/632 |

FOREIGN PATENT DOCUMENTS

| | | | |
|---|---|---|---|
| 0083065 | 5/1982 | Japan | 257/323 |
| 59-8341 | 1/1984 | Japan | . |
| 63-53703 | 10/1988 | Japan | . |
| 0028869 | 1/1989 | Japan | 257/323 |
| 1134935 | 5/1989 | Japan | . |
| 2162773 | 6/1990 | Japan | . |
| 3-129734 | 6/1991 | Japan | . |
| 6267941 | 9/1994 | Japan | . |
| 63-33922 | 12/1994 | Japan | . |

OTHER PUBLICATIONS

Yukio Yasuda, "Plasma CVD Technology and Its Applications", Japanese Applied Physics, vol. 50, No. 6, pp. 638–649 (1981).

"Plasma CVD" by Takeo Yoshimi; Semiconductor World, 1983.2; pp., 49–57 (w/English summary).

"Recent Research and Development on Silicon Nitride Thin Films" by Shizuo Fujita et al; Appl. Phys. vol. 54, No. 12; 1985; pp., 1250–1266 (w/partial English translation).

T. H. Tom Wu et al: Solid State Technology: Jul., 1992; pp., 23–31 (w/partial English translation).

"Properties of Plasma–Deposited Silicon Nitride" by H. J. Stein et al; J. Electrochem. Socc.: Solid–State Science And Technoligy, vol. 126, No. 10; Oct., 1979; pp., 1750–1753.

"Reactive Plasma Deposited Si–N Films for MOS–LSI Passivation" by A. K. Sinha et al; J. Electrochem. Soc.: Solid–State Science And Technology, vol. 125, No. 4; Apr., 1978; pp. 601–608.

"Configurational statistics in a–$Si_xN_yH_z$alloys: A quantitative bonding analysis" by E. Bustarret et al; 1988 The American Physical Society, vol. 38, No. 12; Oct. 15, 1988; pp. 8171–8184.

"The Hydrogen content of plasma–deposited silicon nitride" by W. A. Lanford et al; J. Appl. Phys. 49(4), Apr. 1978; pp. 2473–2477.

*Primary Examiner*—Robert P. Limanek
*Assistant Examiner*—David Hardy
*Attorney, Agent, or Firm*—Cushman Darby & Cushman Group of Pillsbury Madison & Sutro L.L.P.

[57] ABSTRACT

A semiconductor device includes a semiconductor element. A silicon nitride film covers the semiconductor element. The silicon nitride film is made of $Si_xN_yH_z$, where X, Y, and Z denote atomic fractions of Si, N, and H respectively. The silicon nitride film relates to an optical absorption edge wavelength shorter than 254 nm. A mean area of regions surrounded by crystal-like grain boundaries at a surface of the silicon nitride film is equal to $4.5 \times 10^4$ nm$^2$ or more. The semiconductor element may include a memory element from which information can be erased by exposure to ultraviolet rays.

3 Claims, 14 Drawing Sheets

| | SiH₄ / NH₃ / N₂ | FLOW RATIO | STEP COVERING RATE |
|---|---|---|---|
| a: | 75sccm/50sccm/4500sccm | 0.0277 | 51.6 % |
| b: | 75sccm/90sccm/4500sccm | 0.0366 | 54.6 % |
| c: | 75sccm/65sccm/2500sccm | 0.0560 | 56.3 % |
| d: | 75sccm/65sccm/1500sccm | 0.0933 | 66.2 % |
| e: | 75sccm/65sccm/1000sccm | 0.1400 | 72.3 % |

0                                    2000nm

SILICON NITRIDE FILM HAVING A SHORT ABSORPTION WAVELENGTH AND SURROUNDING CRYSTAL-LIKE GRAIN BOUNDARIES

BACKGROUND OF THE INVENTION

1. Field of the Invention

This invention relates to a semiconductor device having a silicon nitride film which forms an inter-layer film or a protective film designed to transmit ultraviolet rays. This invention also relates to a method of fabricating such a semiconductor device. One example of the semiconductor device of this invention is an ultraviolet erasable ROM (read-only memory) or an EPROM (an electrically programmable read-only memory or an erasable programmable read-only memory).

2. Description of the Prior Art

Some ultraviolet erasable ROM's use a silicon nitride film as a protective insulating film. In general, a silicon nitride film is formed in a reaction chamber by a plasma enhanced CVD (chemical vapor deposition) process.

Japanese published examined patent application 63-53703 discloses a semiconductor device having a silicon nitride film designed to transmit ultraviolet rays. In Japanese application 63-53703, a composition ratio "Si/N" (that is, an atomic ratio between silicon and nitrogen) of the silicon nitride film is preferably in the range of 0.65 to 0.825 to make the silicon nitride film sufficiently transparent with respect to ultraviolet rays having wavelengths equal to or shorter than 300 nm.

Japanese published unexamined patent application 3-129734 reports that a silicon nitride film having a composition ratio "Si/N" in the range of 0.65 to 0.825 tends to exert a great stress on a base or an under layer. Japanese application 3-129734 teaches a second insulating layer made of $SiO_2$ which is provided between the silicon nitride film and the base.

Japanese Journal of Applied Physics, Vol 50, No. 6, pp. 638–649, 1981, indicates "Plasma CVD Technology and Its Application" which shows that a silicon nitride film made by a plasma enhanced CVD process has a great internal stress. Such a silicon nitride film inevitably contains hydrogen atoms. Further, it is shown that the strength of the internal stress depends on film growth conditions such as a composition ratio "Si/N" and a hydrogen atom concentration. Also, it is shown that an internal stress of a compression type weakens as a hydrogen atom concentration increases.

Japanese published unexamined patent application 6-267941 discloses a device protecting film including an ultraviolet transmissible SiN film. In Japanese application 6-267941, the SiN film is formed by a plasma enhanced CVD process. The SiN film has a composition ratio "Si/N" which preferably falls within the range of 0.75 to 0.87. An Si—H bond concentration "Z" ($cm^{-3}$) in the SiN film is approximately expressed by the following formula.

$$Z = 1.58 \times 10^{22} X - 9.94 \times 10^{21}$$

where "X" denotes the composition ratio "SiN". Further, a hydrogen bond concentration "Y" ($cm^{-3}$) in the SiN film which determines the Si—H bond concentration is approximately expressed by the following formula.

$$Y = 1.01 \times 10^{22} X + 0.54 \times 10^{22}$$

In addition, Japanese application 6-267941 shows that the SiN film transmits ultraviolet rays having a wavelength of 254 nm, and that the SiN film has a reduced internal stress and a high moisture resistance.

SUMMARY OF THE INVENTION

It is a first object of this invention to provide an improved semiconductor device having a silicon nitride film.

It is a second object of this invention to provide an improved method of fabricating a semiconductor device having a silicon nitride film.

A first aspect of this invention provides a semiconductor device comprising a semiconductor element; and a silicon nitride film covering the semiconductor element and being made of $Si_xN_yH_z$, where X, Y, and Z denote atomic fractions of Si, N, and H respectively, the silicon nitride film relating to an optical absorption edge wavelength shorter than 254 nm, wherein a mean area of regions surrounded by crystal-like grain boundaries at a surface of the silicon nitride film is equal to $4.5 \times 10^4$ $nm^2$ or more.

A second aspect of this invention is based on the first aspect thereof, and provides a semiconductor device wherein the semiconductor element comprises a nonvolatile memory element from which information can be erased by exposure to ultraviolet rays.

A third aspect of this invention provides a semiconductor device comprising a substrate; a wiring line provided on the substrate and having a flat portion and an edge; a semiconductor element provided on the substrate; and a silicon nitride film provided on the substrate and covering the wiring line and the semiconductor element, the silicon nitride film relating to an optical absorption edge wavelength shorter than 254 nm; wherein a thickness of the silicon nitride film on the flat portion of the wiring line is denoted by "a", and a smallest thickness of the silicon nitride film which is measured from the edge of the wiring line is denoted by "b", and wherein a ratio "b/a" is equal to 56% or more.

A fourth aspect of this invention provides a method of fabricating a semiconductor device which comprising the steps of supplying silane ($SiH_4$) gas, ammonia ($NH_3$) gas, and nitrogen ($N_2$) gas at given flow rates respectively to form a mixture thereof; making the mixture of silane ($SiH_4$) gas, ammonia ($NH_3$) gas, and nitrogen ($N_2$) gas into plasma; and forming a silicon nitride film on a semiconductor element from the plasma; wherein a ratio of a sum of the flow rate of silane ($SiH_4$) gas and the flow rate of ammonia ($NH_3$) gas to the flow rate of nitrogen ($N_2$) gas is equal to 0.0560 or more, and a ratio of the flow rate of silane ($SiH_4$) gas to the flow rate of ammonia ($NH_3$) gas is equal to 1.7 or less.

A fifth aspect of this invention is based on the fourth aspect thereof, and provides a method wherein the making step comprises feeding electric power to the mixture, the electric power having a density in the range of 1.39 to 2.06 $W/cm^2$.

A sixth aspect of this invention is based on the fourth aspect thereof, and provides a method further comprising the step of maintaining a pressure of the mixture in the range of 5.0 to 6.0 Torr.

DESCRIPTION OF THE PREFERRED EMBODIMENTS

A prior-art SiN (silicon nitride) film will be described hereinafter for a better understanding of this invention.

Figure 1:
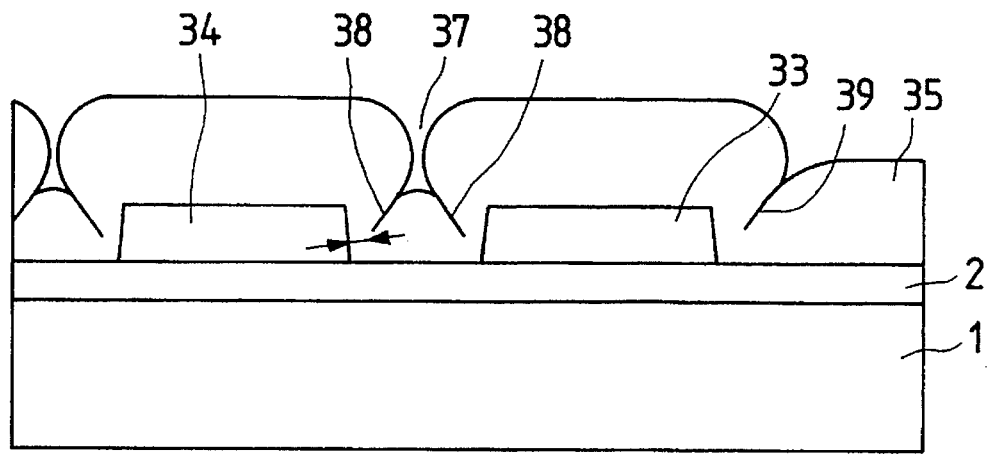
FIG. 1 is a diagram of a SEM photograph which shows a cross section of a prior-art semiconductor device having a prior-art SiN film made by a prior-art method.

With reference to FIG. 1, a prior-art semiconductor device includes a substrate 1 on which an insulating film 2 of boron phosphosilicate glass (BPSG) extends. Al (aluminum) wiring lines 33 and 34 extend on the insulating film 2. Upper surfaces of the Al wiring lines 33 and 34 and upper surfaces of the insulating film 2 are covered or coated with a prior-art SiN film 35 formed by a prior-art plasma enhanced CVD process. The prior-art SiN film 35 serves as a protective insulating film designed to transmit ultraviolet rays (UV).

In the prior-art semiconductor device of FIG. 1, the Al wiring lines 33 and 34 are close to each other. Therefore, a region between the Al wiring lines 33 and 34 tends to be insufficiently filled with the prior-art SiN film 35. Thus, the region between the Al wiring lines 33 and 34 has a recess or a groove 37 having an approximately triangular cross-section. In the prior-art semiconductor device of FIG. 1, edges of the Al wiring lines 33 and 34 provide relatively-great steps with respect to upper surfaces of the insulating film 2. The steps cause slits 38 and 39 in the prior-art SiN film 35. The slits 38 and 39 have widths of about 10 nm. Such slits are referred to as nano-slits.

It is thought that the nano-slits 38 and 39 are formed as follows. During the deposition of the SiN film 35, the shadowing phenomenon makes it hard that a precursor —($Si_l$—$N_m$—$H_n$) of the film reaches an area near a lower corner at each step. The precursor of the film results from reaction between silane and ammonia. The deposition proceeds while a central part of this area continues to be substantially unoccupied. On the other hand, the other part of the area is occupied by deposited SiN material coming from neighboring areas. The unoccupied central part of the area constitutes a nano-slit.

In the region between the Al wiring lines 33 and 34, the nano-slits 38 form arm portions of an inverted-Y-shaped groove respectively. The nano-slits 38 and 39 can be observed through electron microscopes for cross-sectional images. In general, water tends to enter the nano-slits 38 and 39 and to facilitate deterioration of the prior-art semiconductor device and corrosion of the Al wiring lines 33 and 34.

BRIEF DESCRIPTION OF EMBODIMENTS

Figure 2:
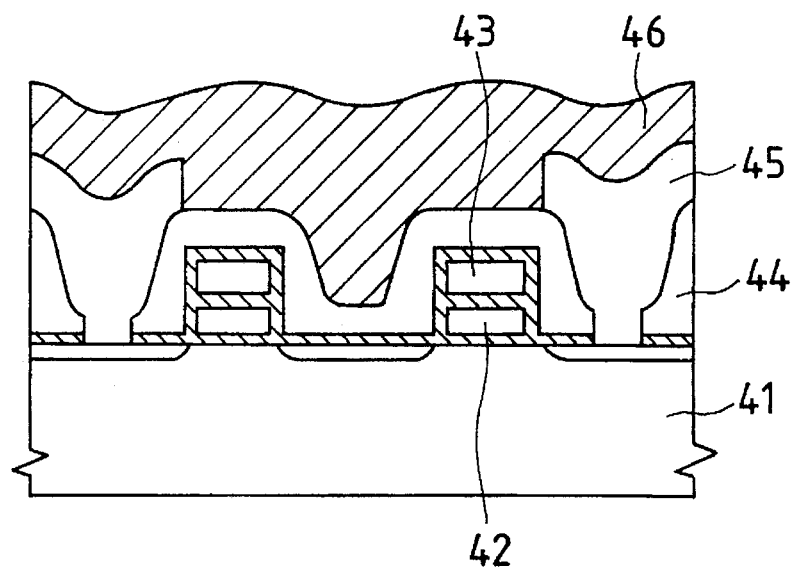
FIG. 2 is a sectional view of an ultraviolet erasable ROM according to an embodiment of this invention.

With reference to FIG. 2, an ultraviolet erasable ROM (read-only memory) includes an Si substrate 41 on which a floating gate 42 and a control gate 43 are formed. One example of the ultraviolet erasable ROM is an EPROM (an electrically programmable read-only memory or an erasable programmable read-only memory). The floating gate 42 and the control gate 43 vertically align with each other, and are separated from each other by an insulating layer. The floating gate 42 and the control gate 43 include polycrystalline silicon films respectively. An inter-layer insulating film 44 extending on the substrate 41 covers the floating gate 42 and the control gate 43. The inter-layer insulating film 44 includes a boron phosphosilicate glass (BPSG) film formed by atmosphere CVD. An Al wiring line 45 extends into a contact hole provided through the inter-layer insulating film 44. Upper surfaces of the inter-layer insulating film 44 and the Al wiring line 45 are covered or coated with an SiN film (a silicon nitride film) 46. The SiN film 46 serves as a protective insulating film designed to transmit ultraviolet rays (UV). The SiN film 46 is formed by a plasma enhanced CVD process.

Figure 3:
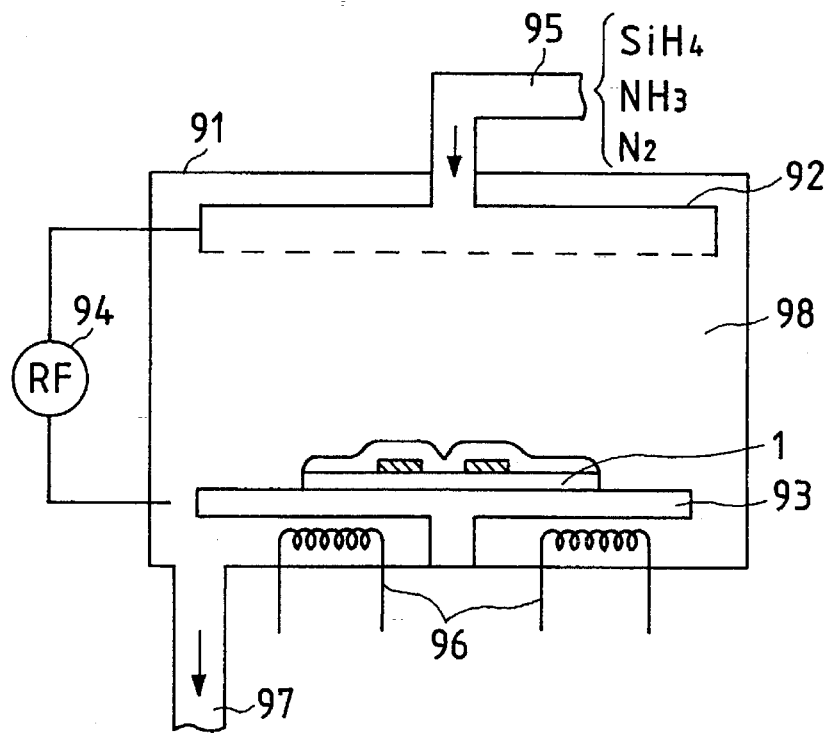
FIG. 3 is a diagram of a portion of a plasma enhanced CVD apparatus.

FIG. 3 shows a plasma enhanced CVD apparatus for executing the plasma enhanced CVD process by which the SiN film 46 is formed. As shown in FIG. 3, the plasma enhanced CVD apparatus includes a reaction chamber (a vacuum chamber) 91 in which an upper electrode 92 and a lower electrode 93 are disposed. Silane ($SiH_4$) gas, ammonia ($NH_3$) gas, and nitrogen ($N_2$) gas are introduced via an inlet passage 95 into the reaction chamber 91 as material gases. The upper electrode 92 includes a plate having an inlet opening via which the material gases enter the reaction chamber 91. A substrate 1 is located on the lower electrode 93. The substrate 1 on the lower electrode 93 is heated by heaters 96. An RF power supply 94 applies RF electric power between the upper electrode 92 and the lower electrode 93, thereby generating plasma 98 in the reaction chamber 91. The RF electric power has a frequency of 13.56 MHz. The generation of the plasma causes the material gases react on each other. As a result, an SiN film deposits on the substrate 1. The reaction chamber 91 is evacuated via an outlet passage 97.

In the ultraviolet erasable ROM of FIG. 2, side edges of the Al wiring line 45 provide steps with respect to upper surfaces of the inter-layer insulating film 44. The steps are covered with the SiN film 46 which is formed by the plasma enhanced CVD process. A conceivable factor determining the degree of the covering of the steps with the SiN film 46 is a surface migration distance which occurs when a precursor of the SiN film 46 reaches exposed surfaces on the substrate 41. The precursor of the SiN film 46 results from reaction between silane ($SiH_4$) gas and ammonia ($NH_3$) gas in the plasma.

As previously described, silane ($SiH_4$) gas, ammonia ($NH_3$) gas, and nitrogen ($N_2$) gas are introduced into the reaction chamber of the plasma enhanced CVD apparatus of FIG. 3 as material gases.

It is thought that as the mount (or flow) ratio of nitrogen ($N_2$) gas to the other gases decreases, the reactivities of the material gases increase and hence the reaction between silane ($SiH_4$) and ammonia ($NH_3$) accelerates. Thus, a precursor of the SiN film 46 which is formed at a low amount (or flow) ratio of nitrogen ($N_2$) gas to the other gases is thought to be a high polymer or a macromolecule rich in Si—N bonds and H terminations (ends). It is thought that the interaction between such a precursor and the substrate surface is relatively weak, and the precursor exhibits good migration at the substrate surface. Thus, it appears that such a precursor easily covers the steps.

In the ultraviolet erasable ROM of FIG. 2, the SiN film 46 effectively absorbs ultraviolet rays having wavelengths equal to or shorter than a given wavelength referred to as an optical absorption edge wavelength. To attain an optical absorption edge wavelength shorter than 254 nm, it is preferable to reduce the rate of flow of silane ($SiH_4$) gas relative to the rate of flow of ammonia ($NH_3$) gas during the formation of the SiN film 46. The reduction in the rate of flow of silane ($SiH_4$) gas decreases the hydrogen (H) concentration in the SiN film 46. To make an internal stress in the SiN film 46 equivalent to a weak compression stress (a weak compressible stress), it is preferable to enhance the surface migration as previously described. The enhanced surface migration relieves the internal stress. Further, it is preferable to reduce RF power during the formation of the SiN film 46. The reduced RF power enables the SiN film 46 to be less adversely affected by ion bombardment.

Preferable conditions of making the SiN film 46 were determined according to experiments. Specifically, the ratio R1 of the flow rate of silane ($SiH_4$) gas and ammonia ($NH_3$) gas to the flow rate of nitrogen ($N_2$) gas was preferably equal to 0.0560 or more. Here, the flow rate of silane ($SiH_4$) gas and ammonia ($NH_3$) gas means the sum of the flow rate of silane ($SiH_4$) gas and the flow rate of ammonia ($NH_3$) gas. The mixing ratio of silane ($SiH_4$) gas to ammonia ($NH_3$) gas, that is, the ratio of the flow rate of silane ($SiH_4$) gas to the flow rate of ammonia ($NH_3$) gas, was preferably equal to 1.7 or less. Regarding the SiN film 46 which was made under these conditions, it was confirmed that the optical absorption edge wavelength was shorter than 254 nm, and that the degree of the covering of the steps with the SiN film 46 was good and acceptable. Further, the RF power density was preferably in the range of 1.39 to 2.06 W/cm$^2$. It was confirmed that a lower internal stress of the compression type in the SiN film 46 was provided by this setting of the RF power density.

Figure 4:
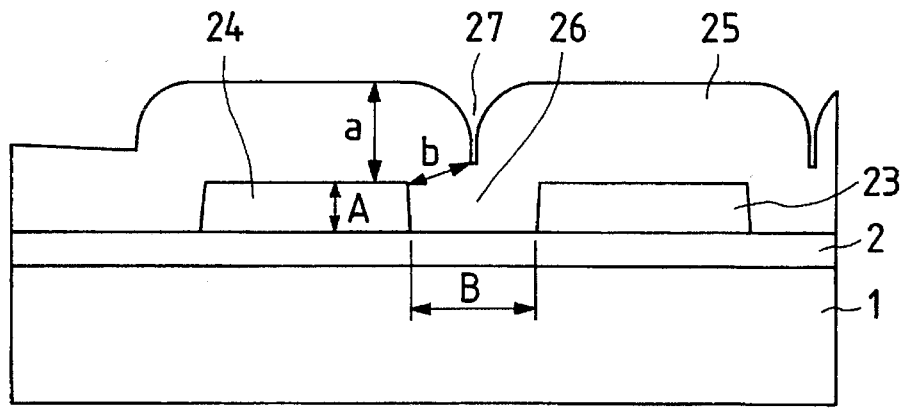
FIG. 4 is a diagram of a SEM photograph which shows a cross section of a semiconductor device according to another embodiment of this invention.

With reference to FIG. 4, a semiconductor device includes a substrate 1 on which an insulating film 2 of boron phosphosilicate glass (BPSG) extends. Al (aluminum) wiring lines 23 and 24 extend on the insulating film 2. Upper surfaces of the Al wiring lines 23 and 24 and upper surfaces of the insulating film 2 are coated with an SiN film 25 formed by a plasma enhanced CVD process. The SiN film 25 serves as a protective insulating film designed to transmit ultraviolet rays (UV).

In the semiconductor device of FIG. 4, upper surfaces of the SiN film 25 have a vertical slit 27 extending toward the center of a region between the Al wiring lines 23 and 24. The character "a" is now introduced as an indication of the thickness of a flat portion of the SiN film 25 extending on the Al wiring line 23 or 24. The character "b" is now introduced as an indication of the thickness of a thinnest portion of the SiN film 25 extending at a step region 26. The thickness "b" is equal to the distance between the bottom of the slit 27 and the upper edge of the Al wiring line 24. The covering of the step region 26 with the SiN film 25 is evaluated by using a step covering rate (a step coverage) equal to the ratio "b/a" between the thickness "a" and the thickness "b". The covering of the step region 26 with the SiN film 25 is better as the step covering rate increases.

Figures 5, 6:
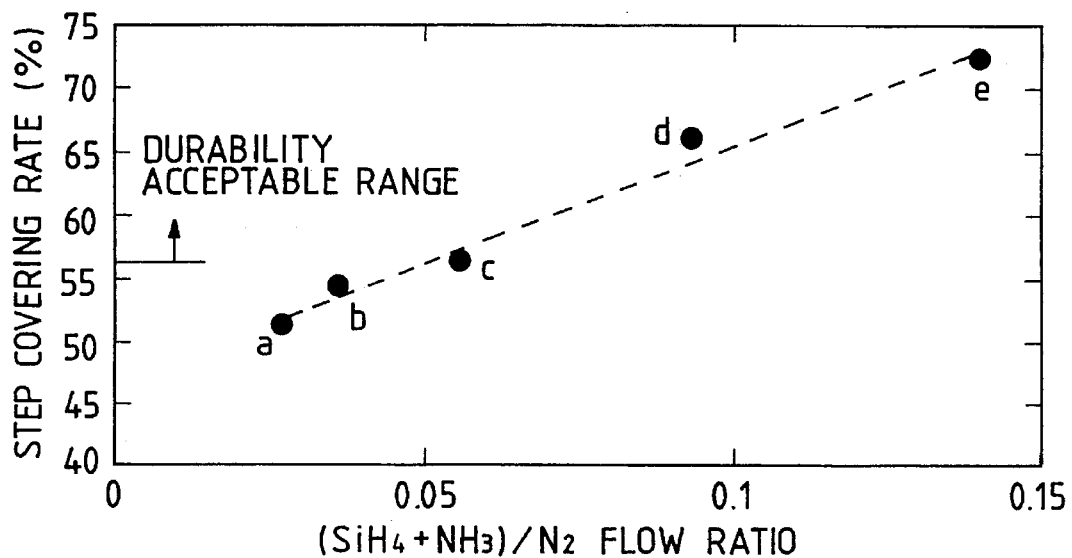
FIG. 5 is a diagram of an experimentally available relation between a step covering rate (a step coverage) and the ratio of the flow rate of silane ($SiH_4$) gas and ammonia ($NH_3$) gas to the flow rate of nitrogen ($N_2$) gas.
FIG. 6 is a diagram of various values in conditions related to samples of the semiconductor device of FIG. 4.

With reference to FIGS. 5 and 6, samples "a", "b", "c", "d", and "e" of the semiconductor device of FIG. 4 were made at different ratios R1 of the flow rate of silane ($SiH_4$) gas and ammonia ($NH_3$) gas to the flow rate of nitrogen ($N_2$) gas. The step covering rates were measured regarding the samples "a", "b", "c", "d", and "e". The measured step covering rates are indicated in FIGS. 5 and 6.

Figure 7:
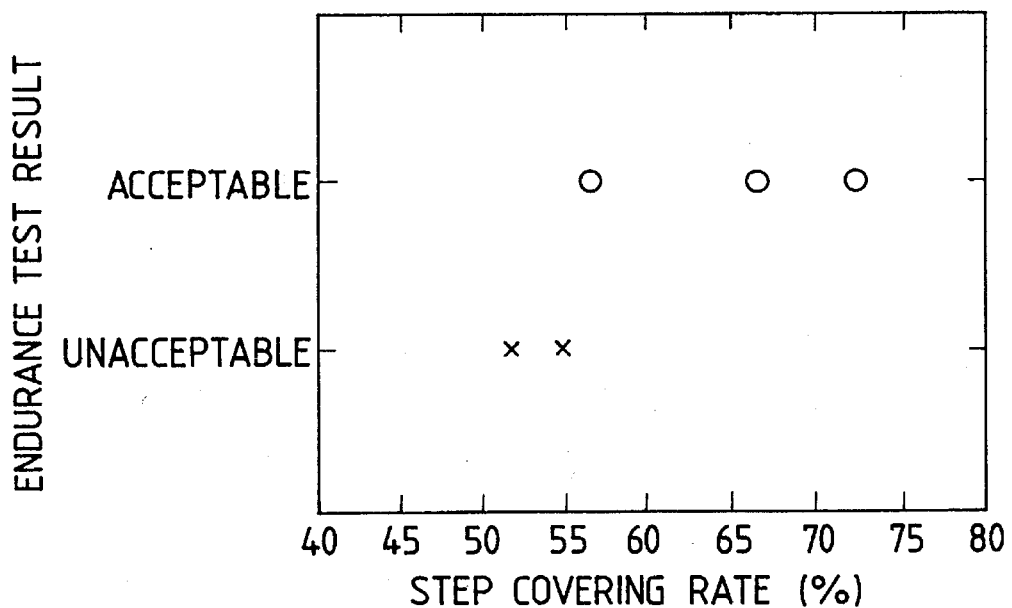
FIG. 7 is a diagram of an experimentally available relation between a step covering rate (a step coverage) and a result of endurance test.

The samples "a", "b", "c", "d", and "e" of the semiconductor device of FIG. 4 were subjected to an endurance test, for example, a pressure cooker test. With reference to FIG. 7, it was found from the endurance test that the samples having step covering rates of 56% or more were acceptably durable. On the other hand, the samples having step covering rates of less than 56% were unacceptable in durability.

Figure 8:
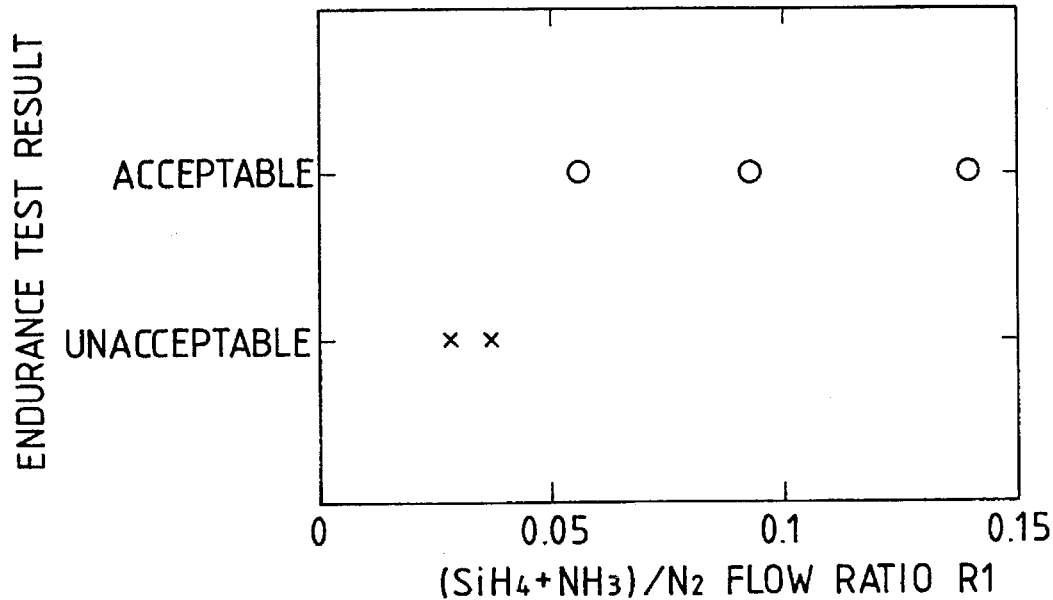
FIG. 8 is a diagram of an experimentally available relation between a result of endurance test and the ratio of the flow rate of silane ($SiH_4$) gas and ammonia ($NH_3$) gas to the flow rate of nitrogen ($N_2$) gas.

A preferable range of the ratio R1 of the flow rate of silane ($SiH_4$) gas and ammonia ($NH_3$) gas to the flow rate of nitrogen ($N_2$) gas was given as follows. With reference to FIG. 8, it was found from the endurance test that the samples related to ratios R1 of 0.0560 or more were acceptably durable. On the other hand, the samples related to ratios R1 of less than 0.0560 were unacceptable in durability.

According to FIGS. 5, 6, 7, and 8, the ratio R1 of the flow rate of silane ($SiH_4$) gas and ammonia ($NH_3$) gas to the flow rate of nitrogen ($N_2$) gas was preferably equal to 0.0560 or more. In the case of this setting, the SiN film 25 had a step covering rate of 56% or more and was thus acceptably durable.

Regarding a general SiN film formed by a plasma enhanced CVD process, an optical absorption edge wavelength is determined by a composition ratio "Si/N" and a hydrogen (H) concentration. It should be noted that the composition ratio "Si/N" means an atomic ratio between silicon and nitrogen. It is thought that an internal stress in the SiN film is determined by the composition of the film and the crystallographical structure of the film. It is thought that a step covering rate is determined by a physical parameter denoting the degree of surface migration. Various experiments and analyses were performed to clarify the crystallographical structure and the physical parameter denoting the degree of surface migration. It is thought that the crystallographical structure and the physical parameter denoting the degree of surface migration are grasped and recognized by observation of film surfaces via an AFM (an atomic force microscope).

Figure 9:
FIG. 9 is a photograph of an image of surfaces of an SiN film with nano-slits which is taken via an AFM (an atomic force microscope).
Figure 10:
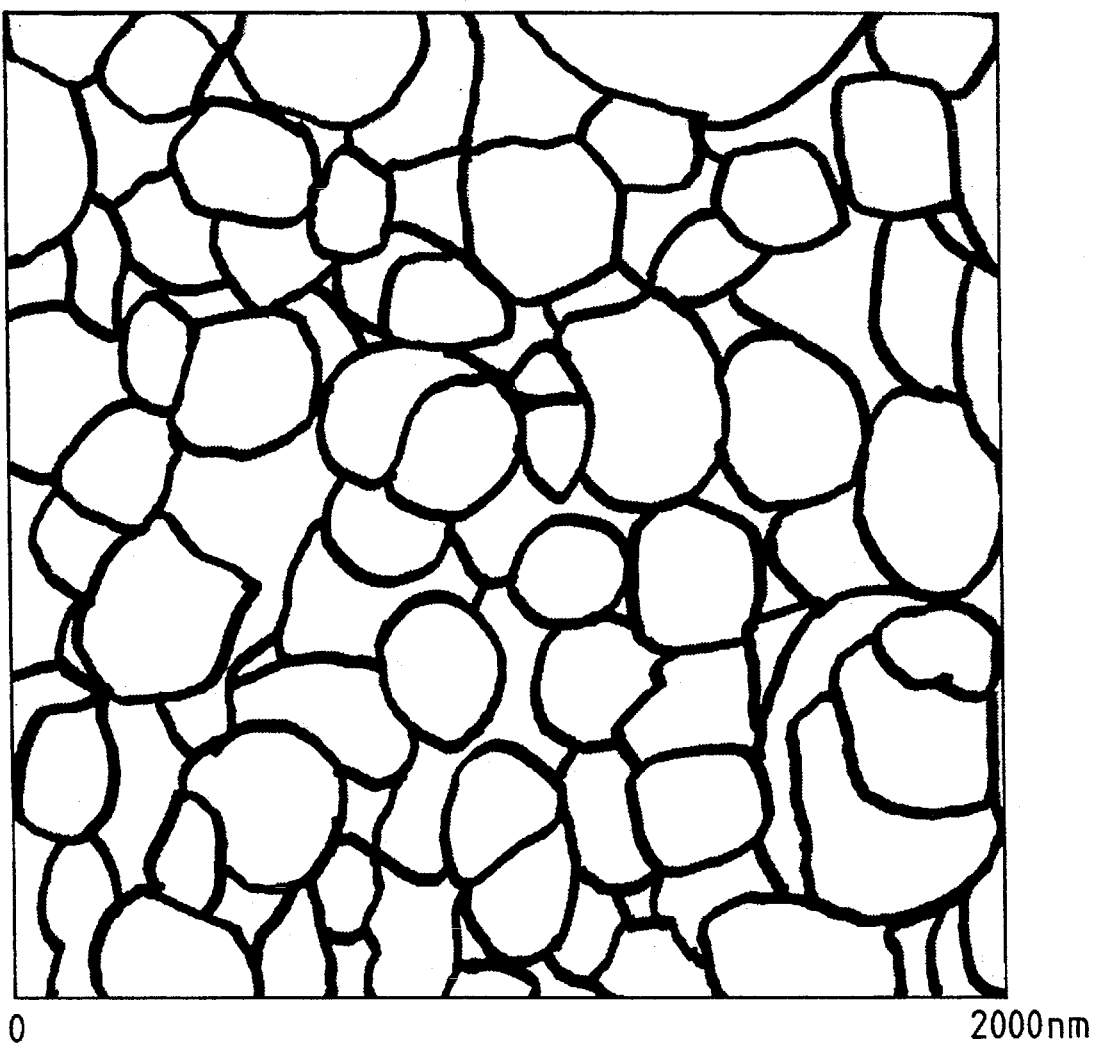
FIG. 10 is a diagram of crystal-like grain boundaries in the photograph in FIG. 9.
Figure 11:
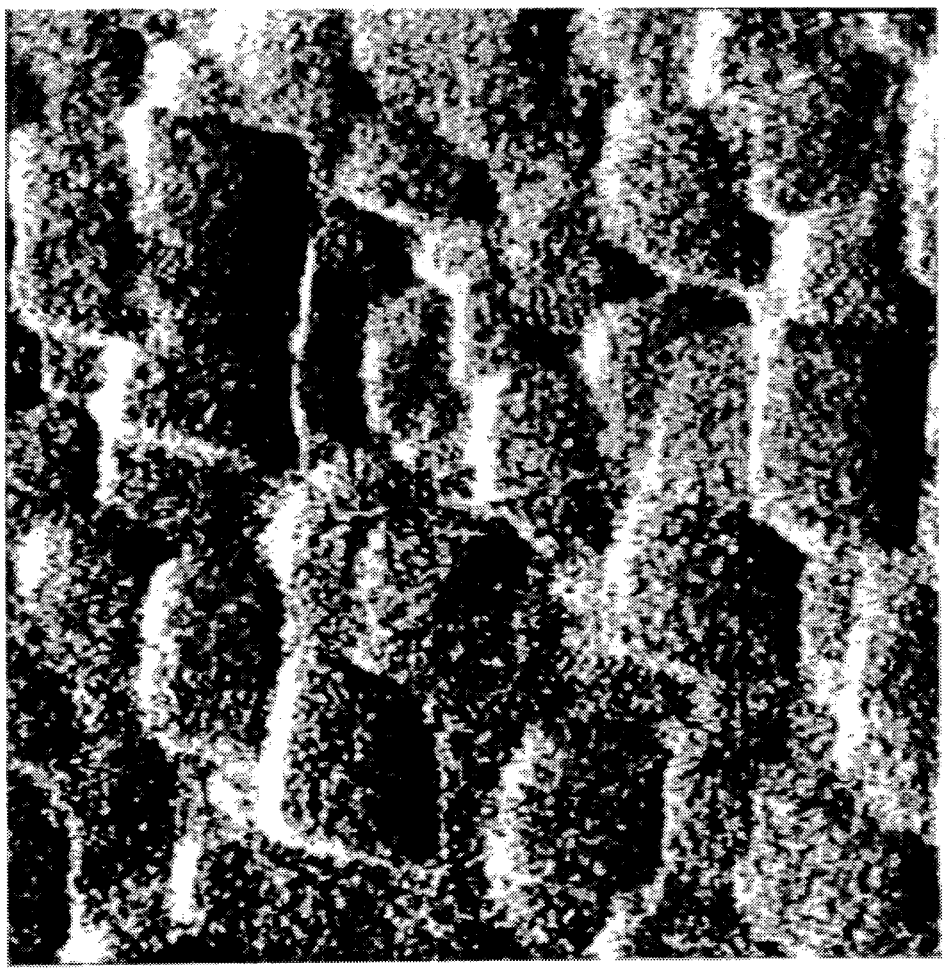
FIG. 11 is a photograph of an image of surfaces of an SiN film free from nano-slits which is taken via the AFM.
Figure 12:
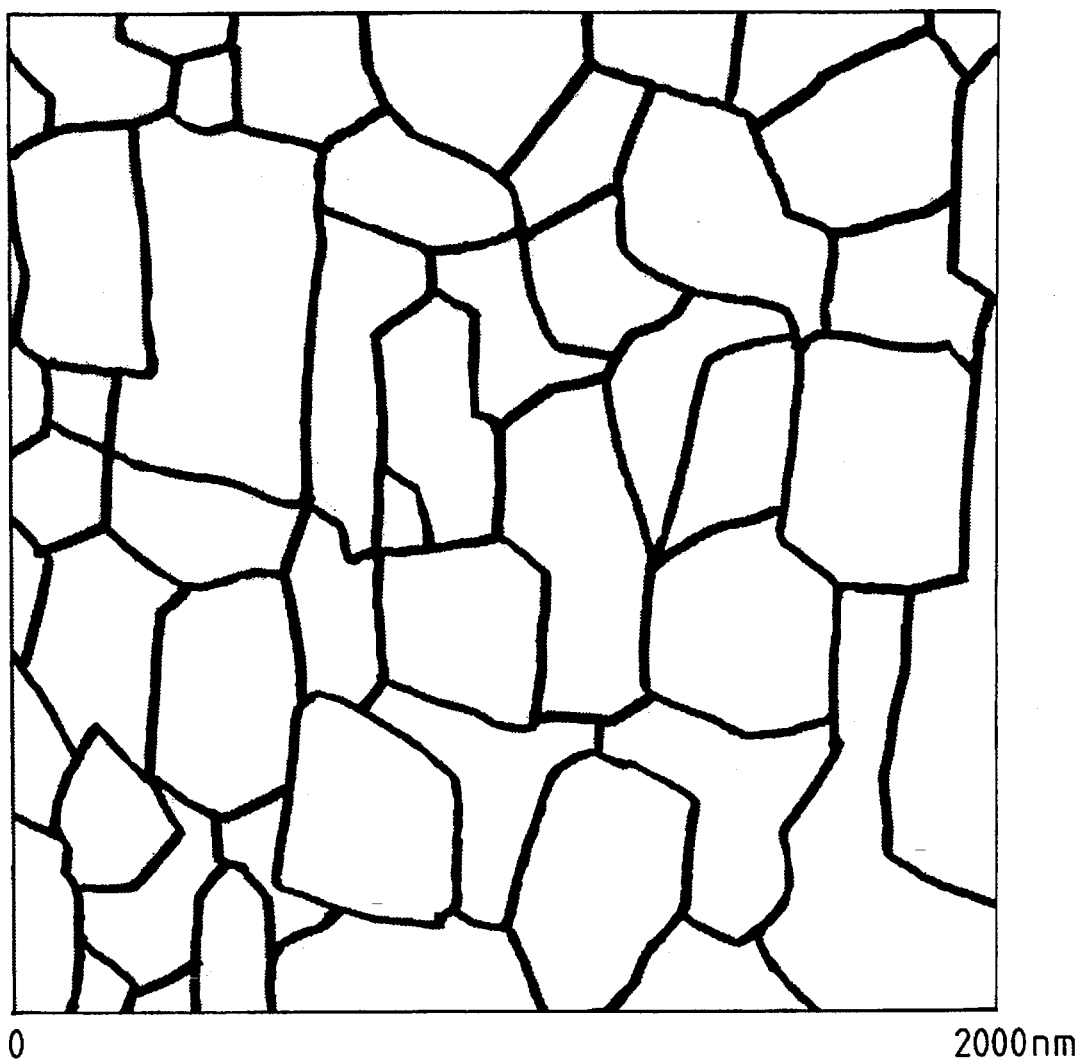
FIG. 12 is a diagram of crystal-like grain boundaries in the photograph in FIG. 11.

FIG. 9 shows an image of surfaces of an SiN film with nano-slits which was taken via the AFM. FIG. 11 shows an image of surfaces of an SiN film free from nano-slits which was taken via the AFM. It was found from FIGS. 9 and 11 that although the SiN films were amorphous, the SiN films had crystal-like grains as thin metal films did. FIG. 10 illustrates crystal-like grain boundaries in the image in FIG. 9. FIG. 12 illustrates crystal-like grain boundaries in the image in FIG. 11. It was found that the areas of crystal-like grains of an SiN film increased as the degree of surface migration was higher and a step covering rate was higher. It is thought that an SiN film with a higher degree of surface migration, that is, an SiN film with a greater mean diameter of crystal-like grains, has a weaker internal compression stress since more effective release of an internal stress occurs during the formation of the SiN film.

In the SiN film of FIGS. 9 and 10, a mean area of regions surrounded by grain boundaries was equal to $2.9 \times 10^4$ $nm^2$. In the SiN film of FIG. 11 and 12, a mean area of regions surrounded by grain boundaries was equal to $5.3 \times 10^4$ $nm^2$. In each of samples of an SiN film having a step covering rate of 56% or more, a mean area of regions surrounded by grain boundaries was equal to $4.5 \times 10^4$ $nm^2$ or more. Accordingly, regarding an SiN film having an optical absorption edge wavelength shorter than 254 nm, it was preferable that a mean area of regions surrounded by grain boundaries was equal to $4.5 \times 10^4$ $nm^2$ or more. Such an SiN film had a relatively-weak internal stress and a good step covering rate.

Detailed Description of First Embodiment

As previously described, the semiconductor device of FIG. 4 includes an Si substrate 1 on which an insulating film 2 of boron phosphosilicate glass (BPSG) extends. Al (aluminum) wiring lines 23 and 24 extend on the insulating film 2. Upper surfaces of the Al wiring lines 23 and 24 and upper surfaces of the insulating film 2 are coated with an SiN film 25 formed by a plasma enhanced CVD process. The SiN film 25 serves as a protective insulating film designed to transmit ultraviolet rays (UV).

Side edges of the Al wiring lines 23 and 24 provide steps with respect to upper surfaces of the insulating film 2. A region between the Al wiring lines 23 and 24 is referred to as a step region 26 defined by the steps at opposing edges of the Al wiring lines 23 and 24. Upper surfaces of the SiN film 25 have a vertical slit 27 extending toward the center of the step region 26. Although the vertical slit 27 is present, the SiN film 25 is free from nano-slits (see the nano-slits 38 and 39 in FIG. 1).

As previously described, the covering of the step region 26 with the SiN film 25 is evaluated by using a step covering rate (a step coverage) equal to the ratio "b/a" where the character "a" denotes the thickness of a flat portion of the SiN film 25 extending on the Al wiring line 23 or 24, and the character "b" denotes the thickness of a thinnest portion of the SiN film 25 extending at the step region 26. The thickness "b" is equal to the distance between the bottom of the slit 27 and the upper edge of the Al wiring line 24. The covering of the step region 26 with the SiN film 25 is better as the step covering rate increases.

As previously described, with reference to FIGS. 5 and 6, samples "a", "b", "c", "d", and "e" of the semiconductor device of FIG. 4 were made at different ratios R1 of the flow rate of silane ($SiH_4$) gas and ammonia ($NH_3$) gas to the flow rate of nitrogen ($N_2$) gas. Here, the flow rate of silane ($SiH_4$) gas and ammonia ($NH_3$) gas means the sum of the flow rate of silane ($SiH_4$) gas and the flow rate of ammonia ($NH_3$) gas. The samples "a", "b", "c", "d", and "e" related to flow ratios R1 of 0.0277, 0.0366, 0.0560, 0.0933, and 0.1400 respectively. The step covering rates were measured regarding the samples "a", "b", "c", "d", and "e". The measured step covering rates are indicated in FIGS. 5 and 6.

The samples "a", "b", "c", "d", and "e" of the semiconductor device of FIG. 4 were subjected to an endurance test, for example, a pressure cooker test. During the pressure cooker test, each of the samples continued to be subjected to given conditions for 96 hours. The given conditions were that the humidity was equal to 90%; the temperature was equal to 121° C.; the pressure was equal to 2 atmospheres; and a given bias voltage was applied to the sample. Then, regarding each of the samples, a check was made as to whether or not a nano-slit (see the nano-slits 38 and 39 in FIG. 1) was present. Further, a check was made as to whether or not a leak current of 0.5 µA or more flowed.

With reference to FIG. 4, the character "A" is now introduced as an indication of the height of the Al wiring line 23 or 24. The character "B" is now introduced as an indication of the distance between the Al wiring lines 23 and 24. In the case where the ratio between the height "A" and the distance "B" was 1:2, optimal conditions of making an SiN film were determined via observation of a step covering rate and a step covering shape.

With reference to FIGS. 5 and 6, the sample "a" related to the smallest flow ratio R1 had a step covering rate of 51.6%, and a cross-sectional TEM (transmission electron microscope) photograph showed the presence of nano-slits therein. Thus, the sample "a" related to the smallest flow ratio R1 was found to be unacceptable (bad). The sample "b" related to the second smallest flow ratio R1 had a step covering rate of about 54.6%, and a cross-sectional TEM (transmission electron microscope) photograph showed the presence of nano-slits therein. According to the result of the endurance test, the sample "b" related to the second smallest flow ratio R1 was found to be unacceptable (bad). According to the result of the endurance test, the samples "c", "d", and "e" related to greater flow ratios R1 were found to be acceptable (good).

With reference to FIG. 7, it was found from the endurance test that the samples having step covering rates of 56% or more were acceptably durable. Thus, it was found that the samples related to flow ratios R1 of 0.0560 or more were acceptably durable (see FIG. 8). On the other hand, the samples having step covering rates of less than 56% were unacceptable in durability. Therefore, the step covering rate was preferably equal to 56% or more.

Regarding the semiconductor device of FIG. 5, it was found that the ratio R1 of the flow rate of silane ($SiH_4$) gas and ammonia ($NH_3$) gas to the flow rate of nitrogen ($N_2$) gas was preferably equal to 0.0560 or more to attain a good device durability. Also, regarding semiconductor devices having other step configurations, the ratio R1 of the flow rate of silane ($SiH_4$) gas and ammonia ($NH_3$) gas to the flow rate of nitrogen ($N_2$) gas is preferably equal to 0.0560 or more.

Conceivable processes are as follows. During the deposition of the SiN film 25, a precursor —$(Si_l$—$N_m$—$H_n)$ of the film results from reaction between silane ($SiH_4$) and ammonia ($NH_3$). In the case of a precursor having a relatively-small molecular weight, the interaction between the precursor and the substrate surface (the surface of the insulating film 2 or the surface of the aluminum wiring line 23 or 24) is though to be relatively strong, and the mobility of the precursor seems low. Thus, it is thought that such a precursor hardly reaches corners of the step region 26, and that the deposition proceeds while the corners of the step region 26 remain unoccupied. To attain a good step covering rate, it is preferable to provide a high-polymer (macromolecule) precursor —$(Si_l$—$N_m$—$H_n)_k$ of the film which weakly reacts with the substrate surface and which has a high mobility.

As previously described, during the execution of the plasma enhanced CVD process, silane ($SiH_4$) gas, ammonia ($NH_3$) gas, and nitrogen ($N_2$) gas are introduced into the reaction chamber of the plasma enhanced CVD apparatus of FIG. 3 as material gases. In the reaction chamber, a mixture of silane ($SiH_4$) gas, ammonia ($NH_3$) gas, and nitrogen ($N_2$) gas is decomposed and made into plasma by discharge energy fed from the RF power supply 94. A precursor of an SiN film is generated from the plasma. The precursor of the film reaches the substrate surface and deposits thereon. To increase the molecular weight of a precursor and to increase the number of H terminations in the precursor, it is preferable to increase the probability of the meeting between reactive gases and thus to increase the degree of the reaction. It is thought that as the amount (or flow) ratio of nitrogen ($N_2$) gas to the other gases decreases, or as the ratio R1 of the flow rate of silane ($SiH_4$) gas and ammonia ($NH_3$) gas to the flow rate of nitrogen ($N_2$) gas increases, precursor fractions —$(Si_l$—$N_m$—$H_n)$ are more easily made into a high polymer or a macromolecule —$(Si_l$—$N_m$—$H_n)_k$. Here, the characters "l", "m", "n", and "k" denote the numbers of related atoms respectively. The probability of the presence of silane ($SiH_4$) gas and ammonia ($NH_3$) gas increases as the probability of the presence of nitrogen ($N_2$) gas decreases. It is thought that as the probability of the presence of silane ($SiH_4$) gas and ammonia ($NH_3$) gas increases, the probability of the meeting between silane ($SiH_4$) gas and ammonia ($NH_3$) gas increases and the reaction between silane ($SiH_4$) gas and ammonia ($NH_3$) accelerates.

An improved step covering rate in the SiN film 25 is confirmed by taking a SEM (scanning electron microscope) photograph or a TEM (transmission electron microscope) photograph of a cross section of the SiN film 25. It is good that a completed SiN film 25 is processed to expose its cross section, and a TEM photograph of the cross section is taken. Since nano-slits are very small, observation thereof via such a TEM photograph tends to be difficult.

Nano-slits may be observed in another way indicated hereinafter. An SiN film is formed in a typical sample of the semiconductor device of FIG. 4. Then, the SiN film is etched for a given time while a mixture of water and hydrofluoric acid (HF) is used as etchant. The mixing ratio between water and hydrofluoric acid (HF) is 1:1. After the etching, a SEM photograph of a cross-section of the resultant SiN film is taken. The etching rates in a flat portion and a step portion of the SiN film are determined or measured by using the SEM photograph. The etching rates in the flat portion and the step portion of the SiN film are compared to calculate the ratio therebetween. When nano-slits are present in the step portion of the SiN film, etchant enters the nano-slits and the etching in the step portion of the SiN film proceeds at a rate higher than the etching rate in the flat portion of the SiN film. Accordingly, a small ratio of the etching rate in the step portion of the SiN film to the etching rate in the flat portion of the SiN film means that nano-slits are negligible or absent. As previously described, the absence of nano-slits corresponds to a good step covering rate.

Figure 13:
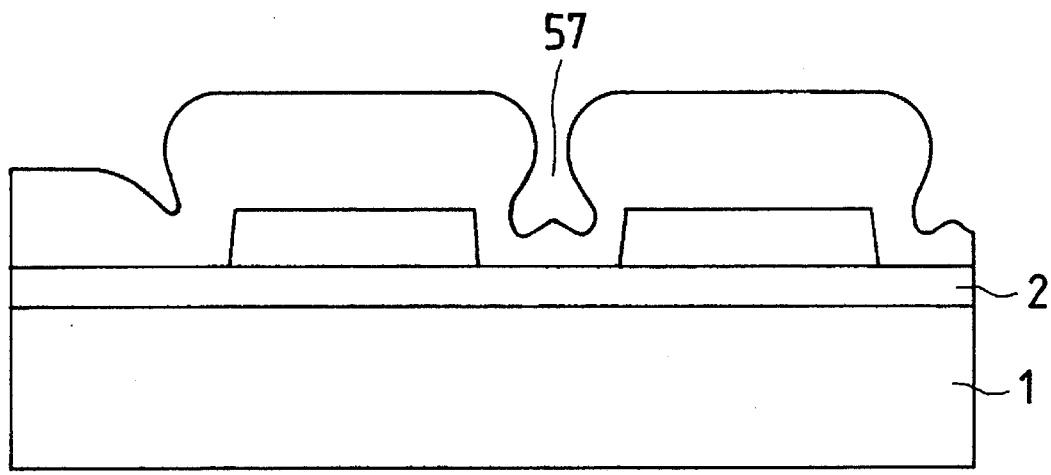
FIG. 13 is a diagram of a SEM photograph showing a cross section of an SiN film in a typical sample of the semiconductor device of FIG. 4 which occurs after etching.
Figure 14:
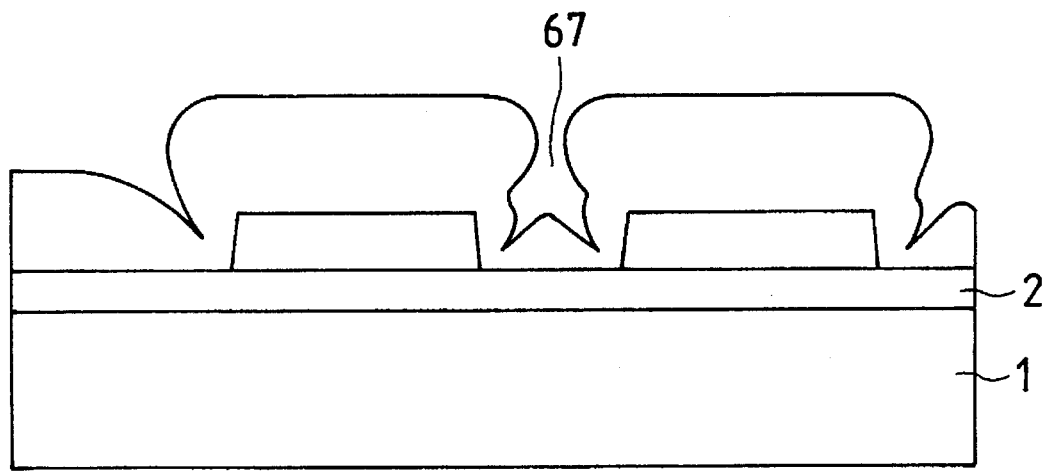
FIG. 14 is a diagram of a SEM photograph showing a cross section of a prior-art SiN film in a typical sample of the prior-art semiconductor device of FIG. 1 which occurs after etching.

FIG. 13 is a diagram of a SEM photograph showing a cross section of an SiN film in a typical sample of the semiconductor device of FIG. 4 which occurs after the above-indicated etching. FIG. 14 is a diagram of a SEM photograph showing a cross section of a prior-art SiN film in a typical sample of the prior-art semiconductor device of FIG. 1 which occurs after the above-indicated etching. As shown in FIGS. 13 and 14, step portions of the SiN films are formed with recesses 57 and 67 by the etching. The shape of the recess 57 or 67 reflects the ratio between the etching rate in the step portion and the etching rate in a flat portion of the related SiN film. It is understood from comparison between the shapes of the recesses 57 and 67 that the SiN film of this invention is substantially free from nano-slits and has a good step covering rate.

It was found that when the flow rate of nitrogen ($N_2$) gas was excessively reduced, maintaining a necessary pressure within the reaction chamber in the plasma enhanced CVD apparatus was difficult. Further, in this case, it was hard to attain good transmission of ultraviolet rays and a low internal stress regarding a resultant SiN film. Specifically, in the case where the ratio R1 of the flow rate of silane ($SiH_4$) gas and ammonia ($NH_3$) gas to the flow rate of nitrogen ($N_2$) gas was equal to 0.140 or less, a resultant SiN film exhibited good transmission of ultraviolet rays and had a weak internal stress. On the other hand, in the case where the flow rate of nitrogen ($N_2$) gas was further reduced so that the ratio R1 increased above 0.140, the pressure within the reaction chamber in the plasma enhanced CVD apparatus was unstable. In this case, a resultant SiN film exhibited poor transmission of ultraviolet rays.

Figure 15:
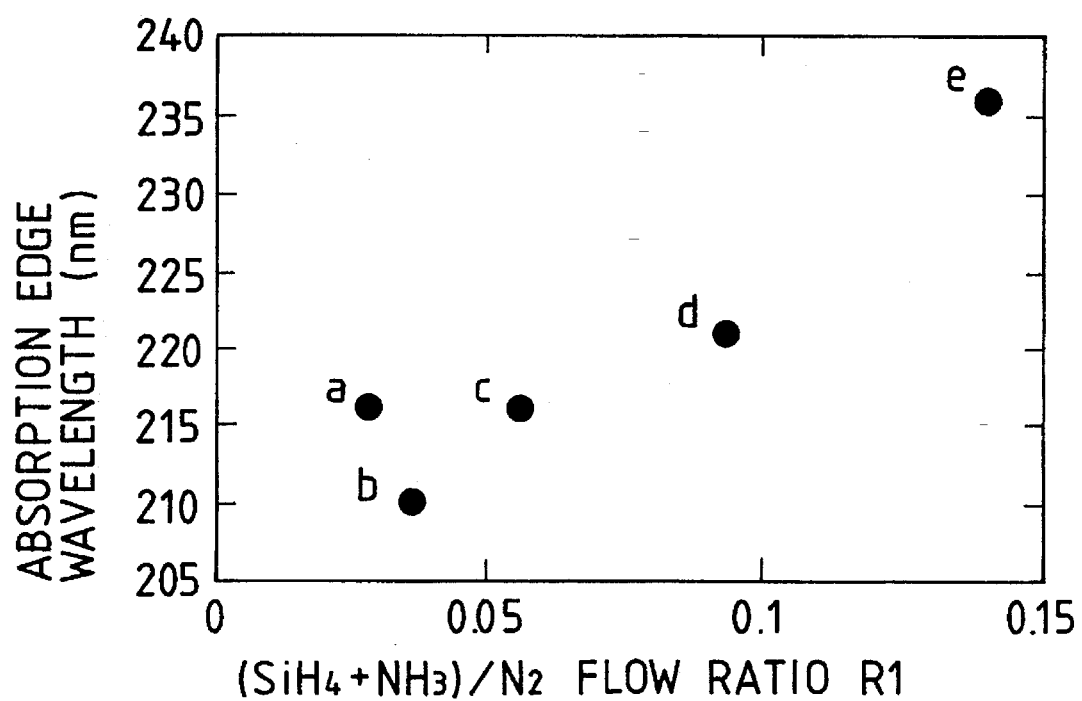
FIG. 15 is a diagram of an experimentally available relation between an optical absorption edge wavelength and the ratio of the flow rate of silane ($SiH_4$) gas and ammonia ($NH_3$) gas to the flow rate of nitrogen ($N_2$) gas.

With reference to FIG. 15, samples "a", "b", "c", "d", and "e" of an SiN film deposited on an Si substrate were made by plasma enhanced CVD under varying conditions similar to those in FIG. 6. Each of the samples of the SiN film had a thickness of about 1.6 μm. It was understood from FIG. 15 that an optical absorption edge wavelength depended on the ratio R1 of the flow rate of silane ($SiH_4$) gas and ammonia ($NH_3$) gas to the flow rate of nitrogen ($N_2$) gas. The durability-acceptable samples "c", "d", and "e" related to optical absorption edge wavelengths shorter than 254 nm. The optical absorption edge wavelength increased as the flow ratio R1 increased. The optical absorption edge wavelength was equal to 236 nm when the flow ratio R1 reached 0.14. In the case where the flow ratio R1 increased above 0.14, there occurred problems such that the optical absorption edge wavelength did not reliably fall into the range shorter than 254 nm, and that the pressure within the reaction chamber in the plasma enhanced CVD apparatus was unstable and an internal stress in a resultant SiN film was unacceptable. Accordingly, a preferable upper limit of the ratio R1 of the flow rate of silane ($SiH_4$) gas and ammonia ($NH_3$) gas to the flow rate of nitrogen ($N_2$) gas is equal to about 0.14 even when the substrate temperature and the RF power density are adjusted during the execution of the CVD process.

The internal stress in the SiN film 25 changes between a compression stress and a tension stress (a tensile stress) depending on film making conditions. In the case of a tension stress, the SiN film 25 tends to be cracked. Accordingly, a compression stress is preferable. Specifically, the internal stress in the SiN film 25 depends on the RF power density and the pressure within the reaction chamber in the plasma enhanced CVD apparatus which occur during the execution of the CVD process. The pressure within the reaction chamber in the plasma enhanced CVD apparatus is also referred to as the reaction-chamber pressure.

Figure 16:
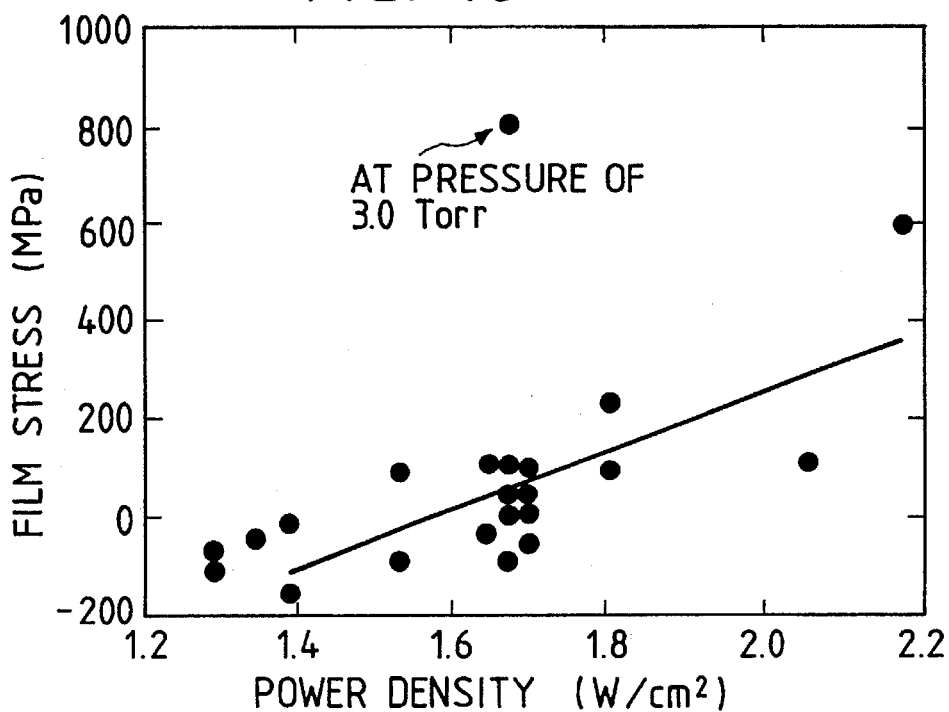
FIG. 16 is a diagram of an experimentally available relation between an RF power density and an internal stress in an SiN film.

About 40 samples of an SiN film deposited on an Si substrate were made by plasma enhanced CVD at different RF power densities respectively. Each of the samples of the SiN film had a thickness of about 1.6 μm. Internal stresses in these samples were measured. As shown in FIG. 16, the internal stress had a certain relation with the RF power density. In FIG. 16, dots correspond to the samples respectively. Further, in FIG. 16, compression stresses are denoted as being positive while tension stresses are denoted as being negative. Also, in FIG. 16, the straight line denotes a regression line which is determined on the basis of the data values of the samples by the least square method. It is understood from FIG. 16 that the internal stress decreases toward a tension side (a tensile side) as the RF power density drops.

Figure 17:
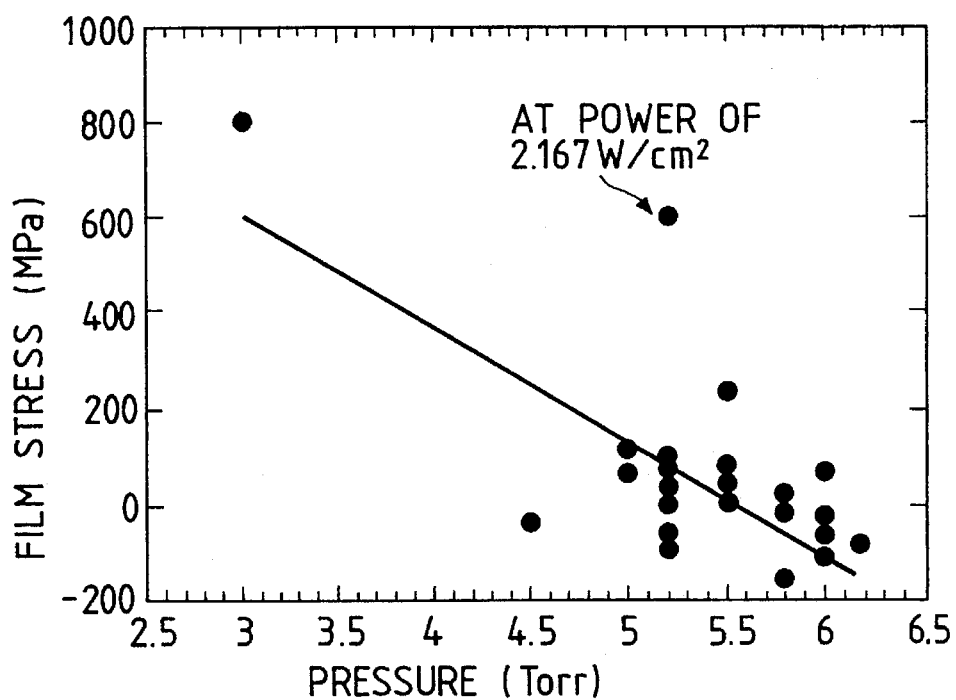
FIG. 17 is a diagram of an experimentally available relation between a pressure within a reaction chamber in a plasma enhanced CVD apparatus and an internal stress in an SiN film.

About 40 samples of an SiN film deposited on an Si substrate were made by plasma enhanced CVD at different pressures within the reaction chamber in the plasma enhanced CVD apparatus respectively. Each of the samples of the SiN film had a thickness of about 1.6 μm. Internal stresses in these samples were measured. As shown in FIG. 17, the internal stress had a certain relation with the pressure within the reaction chamber in the plasma enhanced CVD apparatus (the reaction-chamber pressure). In FIG. 17, dots correspond to the samples respectively. Further, in FIG. 17, compression stresses are denoted as being positive while tension stresses are denoted as being negative. Also, in FIG. 17, the straight line denotes a regression line which is determined on the basis of the data values of the samples by the least square method. It is understood from FIG. 17 that the internal stress shifts toward a compression side (a compressible side) as the pressure in the reaction chamber in the plasma enhanced CVD apparatus (the reaction-chamber pressure) drops.

The internal stress in the SiN film 25 depends on the ratio R2 between the flow rate of silane ($SiH_4$) gas to the flow rate of ammonia ($NH_3$) gas which occurs during the execution of the CVD process. The flow ratio R2 means "$SiH_4/NH_3$". The degree of the dependence of the internal stress upon the flow ratio R2 is considerably smaller than the degree of the dependence of the internal stress upon the RF power density and the degree of the dependence of the internal stress upon the reaction-chamber pressure. As the flow ratio R2 drops, the internal stress shifts from a tension side toward a compression side.

As previously described, the internal stress decreases toward a tension side in accordance with a drop in the RF power density. The internal stress shifts toward a compression side as the pressure in the reaction chamber in the plasma enhanced CVD apparatus (the reaction-chamber pressure) drops. The internal stress shifts toward a compression side as the flow ratio R2 drops. Therefore, the internal stress can be adjusted by controlling the RF power density, the reaction-chamber pressure, and the flow ratio R2.

Calculation was given of the amount of a variation in the internal stress which occurred when each of the RF power density, the reaction-chamber pressure, and the flow ratio R2 was changed independently. The calculated internal-stress variation responsive to the change in the RF power density was equal to 1,000 $MPa/W/cm^2$. The calculated internal-stress variation responsive to the change in the reaction-chamber pressure was equal to –320 MPa/Torr. The calculated internal-stress variation responsive to the change in the flow ratio R2 was equal to –69 MPa/R2.

In general, the RF power density, the reaction-chamber pressure, and the flow ratio R2 affect each other. Since the RF power density hardly affects the degree of transmission of ultraviolet rays, it is easy to determine a preferable range of the RF power density which causes a desired internal stress of an SiN film.

With reference to FIG. 16, samples of an SiN film deposited on an Si substrate were made by plasma enhanced CVD at different RF power densities as described previously. Each of the samples of the SiN film had a thickness of about 1.6 μm. The internal stress was measured in each of the samples. As shown in FIG. 16, samples fabricated at RF power densities of 1.7 $W/cm^2$ or less generally had internal stresses in a tension range. In general, corresponding samples fabricated at increased pressures in the reaction chamber and increased flow ratios R2 had internal stresses in a compression side. In this case, regarding the attainment of an internal compression stress rather than an internal tension stress, it was possible to reduce the RF power density to 1.39 $W/cm^2$. When the RF power density was reduced below 1.39 $W/cm^2$, it was generally difficult to attain an internal compression stress.

The internal stress in the compression side is preferably equal to 200 MPa or less. In the case where an SiN film is formed on an Al wiring line, it is desirable to consider the occurrence of a defect (called an Al void) in the Al wiring line due to a stress of the SiN film. In the case of an Al wiring line having a width of 2 μm or less, the stress of an SiN film is preferably equal to or smaller than 200 MPa to prevent the occurrence of an Al void. With reference to FIG. 16, RF power densities of 1.85 $W/cm^2$ or less generally caused internal stresses of 200 MPa or less. By reducing the reaction-chamber pressure and the flow ratio R2 in view of transmission of ultraviolet rays, it is possible to increase the RF power density up to 2.06 $W/cm^2$ to provide an internal stress of 200 Mpa. In the case where the reaction-chamber pressure and the flow ratio R2 are set to given values to optimize the step covering rate and the degree of transmission of ultraviolet rays, the RF power density is preferably in the range of 1.60 to 1.80 $W/cm^2$.

As previously described, samples of an SiN film deposited on an Si substrate were made by plasma enhanced CVD at different pressures within the reaction chamber. Each of the samples of the SiN film had a thickness of about 1.6 μm. The internal stress was measured in each of the samples. It was understood from FIG. 17 that the internal stress shifted toward a tension side as the pressure within the reaction chamber increased. With reference to FIG. 17, one sample corresponded to an internal stress of 600 MPa and a reaction-chamber pressure of 5.2 Torr. This sample corresponded to an RF power density of 2.167 W/cm². With reference to FIG. 16, one sample corresponded to an internal stress of 800 MPa and an RF power density of 1.7 W/cm². This sample corresponded to a reaction-chamber pressure of 3.0 Torr. Accordingly, the internal stress greatly depended on the RF power density and also the reaction-chamber pressure.

Figure 18:
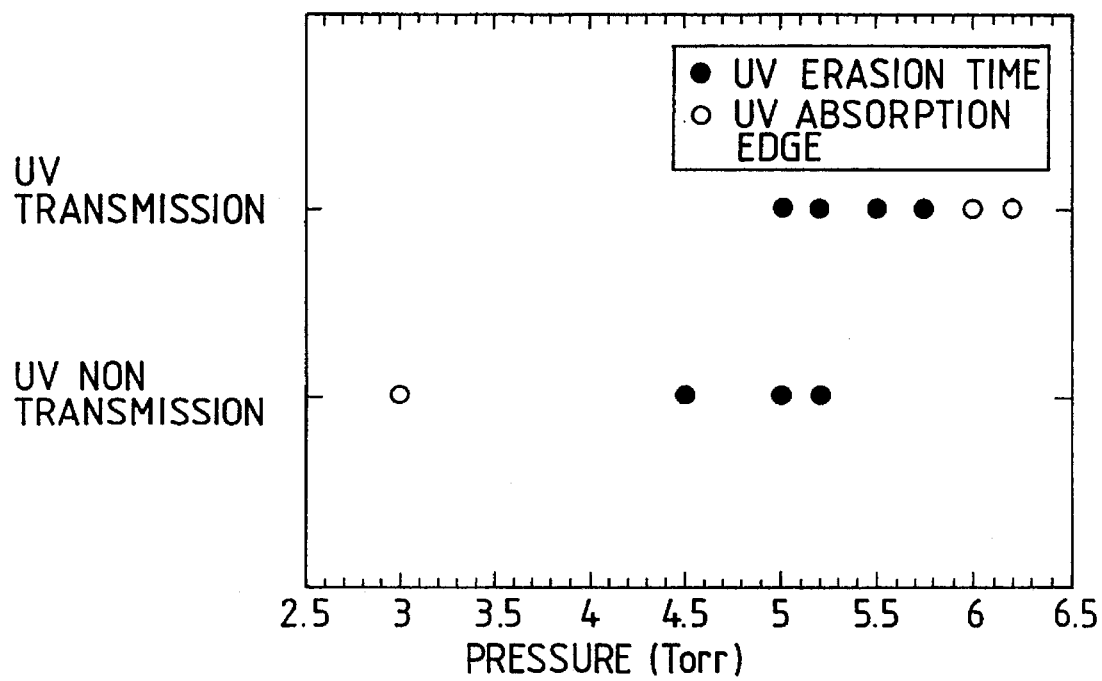
FIG. 18 is a diagram of an experimentally available relation between a pressure within a reaction chamber in a plasma enhanced CVD apparatus and a result of a decision as to whether or not an SiN film transmits ultraviolet rays.

Samples of an EPROM (electrically programable read-only memory or erasable programmable read-only memory) were made at different pressures within the reaction chamber in the plasma enhanced CVD apparatus respectively. Further, samples of an SiN film deposited on an Si substrate were made at different pressures within the reaction chamber. Each of the SiN films in the samples had a thickness of about 1.6 μm. An evaluation was given of whether or not an SiN film in each of the samples transmitted ultraviolet rays. This evaluation was executed by measuring a time taken to remove (erase) electrons from a floating gate in each of the samples, and by checking whether or not an optical absorption edge wavelength related to an SiN film in each of the samples was shorter than 254 nm. It was understood from FIG. 18 that a reaction-chamber pressure of 5.0 Torr corresponded a boundary between transmission and nontransmission of ultraviolet rays (UV). In FIG. 18, black dots corresponded to the samples of the EPROM respectively while white dots corresponded to the samples of the SiN film deposited on the Si substrate.

With reference to FIG. 18, nontransmission of ultraviolet rays at a reaction-chamber pressure of 5.0 or 5.2 Torr was caused by the fact that the ratio R2 between the flow rate of silane ($SiH_4$) gas to the flow rate of ammonia ($NH_3$) gas was higher than 2.0. In FIG. 18, samples denoted by white dots at reaction-chamber pressures of about 3.0 Torr and about 6.0 Torr were evaluated by checking whether or not an optical absorption edge wavelength related to an SiN film in each of the samples was shorter than 254 nm. In FIG. 18, a sample relating to an optical absorption edge wavelength shorter than 254 nm was regarded as a sample transmitting ultraviolet rays. On the other hand, a sample relating to an optical absorption edge wavelength longer than 254 nm was regarded as a sample not transmitting ultraviolet rays. Although there were only three samples (white dots) concerning an optical absorption edge wavelength in FIG. 18, many other samples concerning an optical absorption edge wavelength were actually present. The latter samples overlapped black dots, and they were omitted from FIG. 18 for clarity.

It was found from FIG. 18 that transmission of ultraviolet rays remained acceptable as a reaction-chamber pressure decreased to 5.0 Torr. To provide an internal stress of 200 MPa in view of the RF power density (see FIG. 17), the reaction-chamber pressure is preferably equal to 6.0 Torr or less. Accordingly, it is most preferable that the reaction-chamber pressure is in the range of 5.0 to 6.0 Torr. At a reaction-chamber pressure in this range, an optical absorption edge wavelength was shorter than 254 nm, and was specifically equal to a value between 210 nm and 240 nm. Thus, it is understood from the previous description that the reaction-chamber pressure affects the internal stress and the transmission of ultraviolet rays.

As previously described, in the case where the ratio R1 of the flow rate of silane ($SiH_4$) gas and ammonia ($NH_3$) gas to the flow rate of nitrogen ($N_2$) gas increased above 0.14, there occurred problems such that the optical absorption edge wavelength did not reliably fall into the range shorter than 254 nm, and that the pressure within the reaction chamber in the plasma enhanced CVD apparatus was unstable and an internal stress in a resultant SiN film was unacceptable. Accordingly, a preferable upper limit of the flow ratio R1 is equal to about 0.14.

Figure 19:
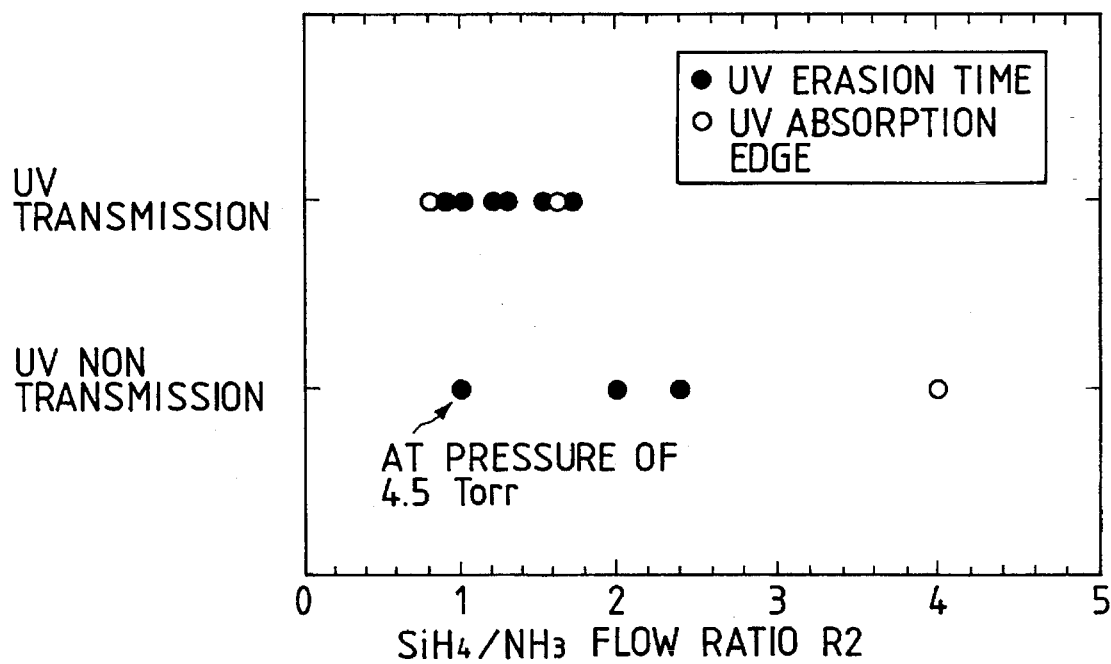
FIG. 19 is a diagram of an experimentally available relation between the ratio of the flow rate of silane ($SiH_4$) gas to the flow rate of ammonia ($NH_3$) gas and a result of a decision as to whether or not an SiN film transmits ultraviolet rays.

Samples of an EPROM (electrically programmable read-only memory or erasable programmable read-only memory) were made at different ratios R2 between the flow rate of silane ($SiH_4$) gas to the flow rate of ammonia ($NH_3$) gas respectively. Further, samples of an SiN film deposited on an Si substrate were made at different flow rates R2. Each of the SiN films in the samples had a thickness of about 1.6 μm. An evaluation was given of whether or not an SiN film in each of the samples transmitted ultraviolet rays. This evaluation was executed by detecting whether or not electrons were removed (erased) from a floating gate in each of the samples in 30 minutes while the sample was continuously irradiated with about 254-nm ultraviolet rays by a mercury-vapor lamp. It was understood from FIG. 19 that the electron removal (the electron erasion) remained acceptable as the flow ratio R2 increased to 1.7. On the other hand, the electron removal (the electron erasion) was poor as the flow ratio R2 increased above 1.7. In FIG. 19, black dots corresponded to the samples of the EPROM respectively while white dots corresponded to the samples of the SiN film deposited on the Si substrate.

With reference to FIG. 19, nontransmission of ultraviolet rays at a flow ratio R2 of 1 was thought to be caused by the fact that the reaction-chamber pressure was relatively low (4.5 Torr). In FIG. 19, samples denoted by white dots were evaluated by checking whether or not an optical absorption edge wavelength related to an SiN film in each of the samples was shorter than 254 nm. It was understood from FIG. 19 that the optical absorption edge wavelength was longer than 254 nm when the flow ratio R2 was relatively great.

Figure 20:
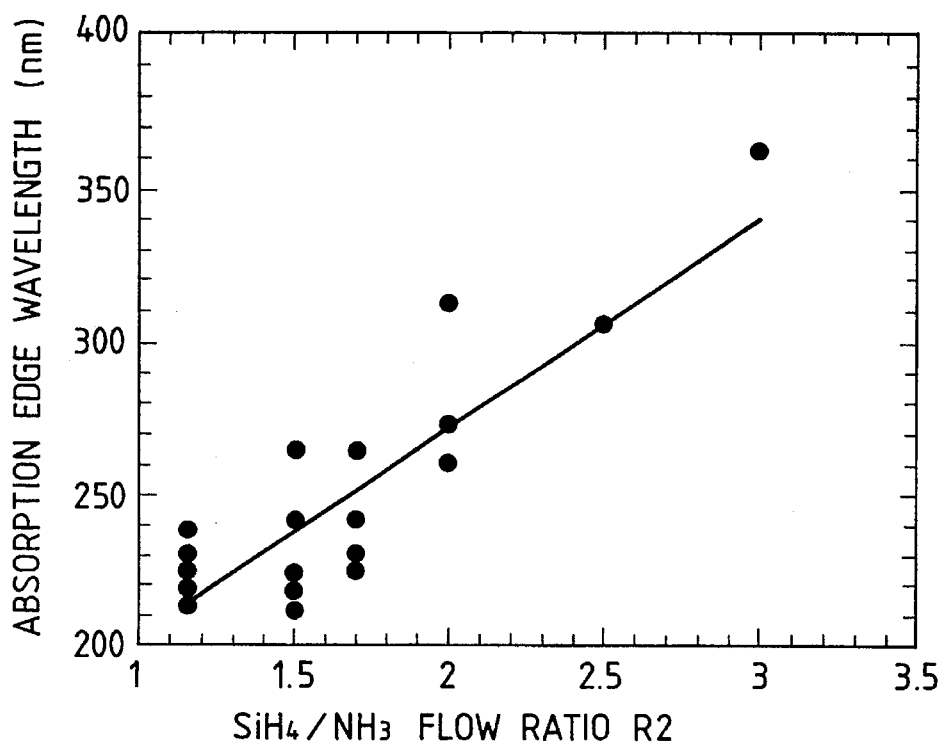
FIG. 20 is a diagram of an experimentally available relation between an optical absorption edge wavelength and the ratio of the flow rate of silane ($SiH_4$) gas to the flow rate of ammonia ($NH_3$) gas.

Samples of an SiN film deposited on an Si substrate were made by plasma enhanced CVD at different flow rates R2. Each of the samples of the SiN film had a thickness of about 1.6 μm. The optical absorption edge wavelength was measured regarding each of the samples of the SiN film. As shown in FIG. 20, the optical absorption edge wavelength had a given relation with the flow ratio R2. Specifically, the optical absorption edge wavelength increased as the flow ratio R2 increased. The optical absorption edge wavelength was loner than 254 nm when the flow ratio R2 increased above 1.7. Accordingly, to attain an optical absorption edge wavelength shorter than 254 nm, the flow ratio R2 is preferably equal to 1.7 or less.

Figure 21:
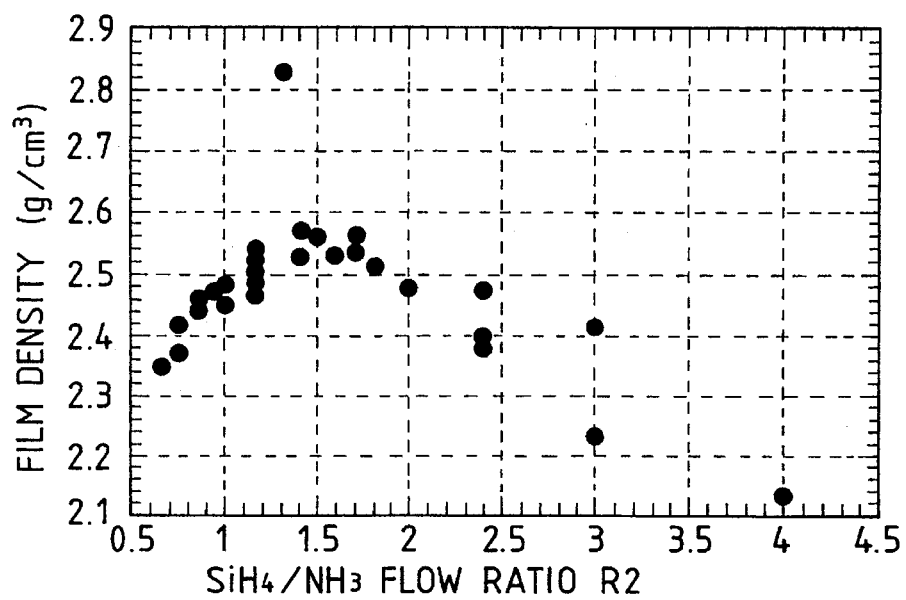
FIG. 21 is a diagram of an experimentally available relation between the density of an SiN film and the ratio of the flow rate of silane ($SiH_4$) gas to the flow rate of ammonia ($NH_3$) gas.

Samples of an SiN film deposited on an Si substrate were made by plasma enhanced CVD at different flow rates R2. Each of the samples of the SiN film had a thickness of about 1.6 μm. The densities of the samples of the SiN film were measured. As shown in FIG. 21, the density of an SiN film had a given relation with the flow ratio R2. Specifically, the film density increased as the flow ratio R2 decreased to about 1.5. Then, the film density decreased as the flow ratio R2 decreased from about 1.5. A decrease in the film density tends to cause a reduction in the film quality and also an increase In the etching rate. Thus, an excessive decrease in the film density results in poor characteristics of a protective film. Accordingly, a preferable lower limit of the flow ratio R2 is equal to about 0.8. As understood from the previous description, it is preferable to set the flow ratio R2 in the range of 0.8 to 1.7. At a flow ratio R2 in this range, an optical absorption edge wavelength was shorter than 254 nm, and was specifically equal to a value between 210 nm and 240 nm.

With reference back to FIG. 4, the SiN film 25 was formed by a CVD process described below. Seven factors relate to the formation of the SiN film 25. Interactions among the seven factors determine conditions of the formation of the SiN film 25. The seven factors are the RF power density, the flow rate of silane ($SiH_4$) gas, the flow rate of ammonia ($NH_3$) gas, the flow rate of nitrogen ($N_2$) gas, the substrate temperature, the reactive gas pressure, and the distance between the upper electrode 92 and the lower electrode 93 (see FIG. 3). It was experimentally confirmed that the distance between the upper electrode 92 and the lower electrode 93 did not considerably affect the step covering rate. Accordingly, the distance between the upper electrode 92 and the lower electrode 93 was fixed to a given value during the formation of the SiN film 25.

The SiN film 25 was formed as follows. First, a substrate 1 of a semiconductor device was placed on the lower electrode 93 in the reaction chamber 91 of the plasma enhanced CVD apparatus of FIG. 3. Second, the reaction chamber 91 was evacuated via the outlet passage 97, and was supplied with silane ($SiH_4$) gas, ammonia ($NH_3$) gas, and nitrogen ($N_2$) gas via the inlet passage 95. The rate of the flow of silane ($SiH_4$) gas into the reaction chamber 91 was set to, for example, 75 sccm. The rate of the flow of ammonia ($NH_3$) gas into the reaction chamber 91 was set to, for example, 65 sccm. The rate of the flow of nitrogen ($N_2$) gas into the reaction chamber 91 was set to, for example, 1,500 sccm. Thus, the ratio R1 of the flow rate of silane ($SiH_4$) gas and ammonia ($NH_3$) gas to the flow rate of nitrogen ($N_2$) gas was equal to, for example, about 0.09. This setting of the flow ratio R1 met the conditions for an acceptable step covering rate. The ratio R2 of the flow rate of silane ($SiH_4$) gas to the flow rate of ammonia ($NH_3$) gas was equal to, for example, about 1.1. This setting of the flow ratio R2 ensured good transmission of ultraviolet rays. The pressure within the reaction chamber 91 was set to, for example, about 5 Torr. Third, the lower electrode 93 was heated by the heaters 96 so that the temperature of the substrate 1 was increased to about 360° C. While the temperature of the substrate 1 remained equal to about 360° C., the RF power supply 94 was adjusted to hold the RF power density in the range of 1.60 to 1.80 W/cm². As a result, an SiN film 25 deposited on the substrate 1. The resultant SiN film 25 had a good quality and a refraction index of 1.91±0.01. The RF power density was defined as being equal to the power generated from the RF power supply 94 which was divided by the area of the lower electrode 93.

The RF power density may be in the range of 1.39 to 2.06 W/cm². The pressure within the reaction chamber 91 may be in the range of 5.0 to 6.0 Torr. The temperature of the substrate 1 may be in the range of 300° C. to 360° C. The flow rate of silane ($SiH_4$) gas may be in the range of 60 to 100 sccm. The flow rate of ammonia ($NH_3$) gas may be in the range of 50 to 120 sccm. The flow rate of nitrogen ($N_2$) gas may be in the range of 1,000 to 3,500 sccm.

Samples of the SiN film 25 were made. Surfaces of the samples of the SiN film 25 were observed via an AFM (an atomic force microscope). FIG. 9 shows an image of surfaces of a sample of the SiN film 25 with nano-slits which was taken via the AFM. FIG. 11 shows an image of surfaces of a sample of the SiN film 25 free from nano-slits which was taken via the AFM. It was found from FIGS. 9 and 11 that although the SiN films were amorphous, the samples of the SiN film 25 had crystal-like grains as polycrystalline films of Al, Ti, and Si formed by a sputtering process or a vapor deposition process did. The boundaries among crystal-like grains are defined as lines connecting low points. Further, regions surrounded by the boundaries are defined as crystal-like grains. FIG. 10 illustrates grain boundaries which is made from the image in FIG. 9 by a tracing process. FIG. 12 illustrates grain boundaries which is made from the image in FIG. 11 by a tracing process.

The AFM images in FIGS. 9 and 11 were subjected to image processing to calculate the areas of crystal-like grains. Calculation was given with respect to every crystal-like grain in a square of 2,000 nm by 2,000 nm on each of the AFM images. Then, a mean value of the areas of the crystal-like grains was calculated on each of the AFM images. In the sample of the SiN film 25 of FIGS. 9 and 10, a mean area of the crystal-like grains was equal to $2.9 \times 10^4$ nm². In the sample of the SiN film 25 of FIG. 11 and 12, a mean area of the crystal-like grains was equal to $5.3 \times 10^4$ nm². In each of the samples of the SiN film 25 which were made under the previously-indicated preferable conditions, a mean area of the crystal-like grains was equal to $4.5 \times 10^4$ nm² or more.

Figure 22:
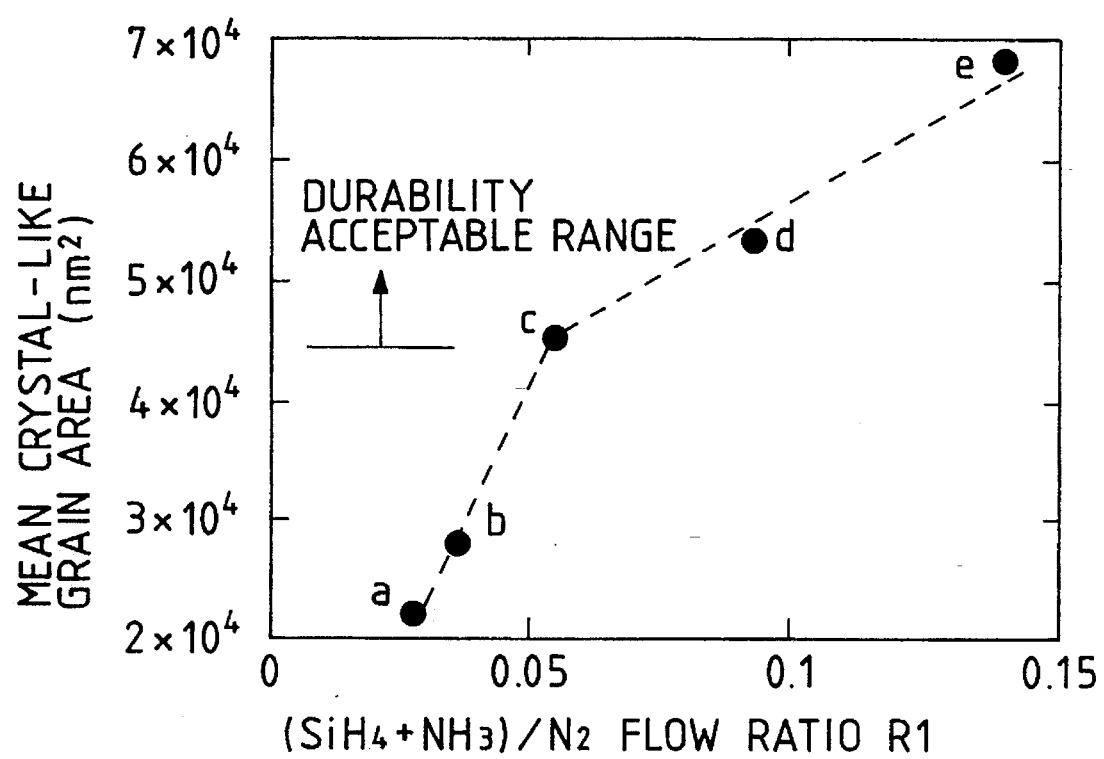
FIG. 22 is a diagram of an experimentally available relation between a mean area of crystal-like grains in an SiN film and the ratio of the flow rate of silane ($SiH_4$) gas and ammonia ($NH_3$) gas to the flow rate of nitrogen ($N_2$) gas.

As previously described, samples "a", "b", "c", "d", and "e" of the semiconductor device of FIG. 4 were made at different ratios R1 of the flow rate of silane ($SiH_4$) gas and ammonia ($NH_3$) gas to the flow rate of nitrogen ($N_2$) gas. A mean area of crystal-like grains in each of the samples "a", "b", "c", "d", and "e" was calculated. As shown in FIG. 22, the mean area of the crystal-like grains increased in accordance with an increase in the flow ratio R1. Regarding the sample "c", the flow ratio R1 was equal to 0.0560 while the mean area of the crystal-like grains was equal to $4.5 \times 10^4$ nm². Regarding the sample "e", the flow ratio R1 was equal to 0.14 while the mean area of the crystal-like grains was equal to $1.1 \times 10^5$ nm². Accordingly, regarding an SiN film having an optical absorption edge wavelength shorter than 254 nm, it was preferable that a mean area of crystal-like grains was equal to $4.5 \times 10^4$ nm² or more. Such an SiN film had a relatively-low internal stress and a good step covering rate.

Detailed Description of Second Embodiment

With reference to FIG. 2, an ultraviolet erasable ROM such as an EPROM includes an Si substrate 41 on which a floating gate 42 and a control gate 43 extend. The floating gate 42 and the control gate 43 vertically align with each other, and are separated from each other by an insulating layer. The floating gate 42 and the control gate 43 are formed by a self-alignment technique. The floating gate 42 and the control gate 43 include polycrystalline silicon films respectively. An inter-layer insulating film 44 extending on the substrate 41 covers the floating gate 42 and the control gate 43. The inter-layer insulating film 44 includes a boron phosphosilicate glass (BPSG) film formed by vapor phase epitaxy. An Al wiring line 45 extends into a contact hole provided through the inter-layer insulating film 44. Upper surfaces of the inter-layer insulating film 44 and the Al wiring line 45 are covered or coated with an SiN film (a silicon nitride film) 46. The SiN film 46 serves as a protective insulating film designed to transmit ultraviolet rays (UV). The SiN film 46 is formed by a plasma enhanced CVD process as the SiN film in the previously-mentioned first embodiment is. In other words, the SiN film 46 is formed similarly to the formation of the SiN film in the previously-mentioned first embodiment.

Information can be stored in the ROM of FIG. 2 by accumulating charges on the floating gate 42. Information can be erased from the ROM of FIG. 2 by applying ultraviolet rays to the floating gate 42 via the SiN film 46 and thereby removing charges from the floating gate 42. Generally, the applied ultraviolet rays have wavelengths of about 254 nm. The composition ratio "Si/N" (that is, the atomic ratio between silicon and nitrogen) of the SiN film 46 is relatively low, and Si—Si bonds in the SiN film 46 are reduced in number. Accordingly, the SiN film 46 efficiently transmits ultraviolet rays. From the standpoint of the prevention of the occurrence of an Al void in a very fine wiring line having a width of, for example, 2 μm or less, it is preferable to set an internal stress in the SiN film 46 as a compression stress of 200 MPa or less. Since the SiN film 46 is made under the previously-indicated preferable conditions for a good step covering rate, the SiN film 46 is substantially free from nano-slits. Accordingly, the SiN film 46 serves as a good protective film having an enhanced durability and an improved reliability.

What is claimed is:

1. A semiconductor device comprising:

a semiconductor element; and a silicon nitride film covering the semiconductor element and being made of $Si_xN_YH_Z$, where X, Y, and Z denote atomic fractions of Si, N, and H respectively, the silicon nitride film relating to an optical absorption edge wavelength shorter than 254 nm, wherein a mean area of regions surrounded by crystal-like grain boundaries at a surface of the silicon nitride film is equal to $4.5 \times 10^4$ $nm^2$ or more.

2. The semiconductor device of claim 1, wherein the semiconductor element comprises a nonvolatile memory element from which information can be erased by exposure to ultraviolet rays.

3. A semiconductor device comprising:

a substrate;

a wiring line provided on the substrate and having a flat portion and an edge;

a semiconductor element provided on the substrate; and a silicon nitride film provided on the substrate and covering the wiring line and the semiconductor element, the silicon nitride film relating to an optical absorption edge wavelength shorter than 254 nm;

wherein a thickness of the silicon nitride film on the flat portion of the wiring line is denoted by "a", and a smallest thickness of the silicon nitride film which is measured from the edge of the wiring line is denoted by "b", and wherein a ratio "b/a" is equal to 56% or more.

* * * * *